(12) United States Patent
Feng et al.

(10) Patent No.: US 9,252,794 B1
(45) Date of Patent: Feb. 2, 2016

(54) FREQUENCY CALIBRATION WITH REAL-TIME RESISTOR TRIMMING

(71) Applicant: International Business Machines Corporation, Armonk, NY (US)

(72) Inventors: Kai Di Feng, Hopewell Junction, NY (US); David R. Hanson, Brewster, NY (US); Chengwen Pei, Danbury, CT (US); Ping-Chuan Wang, Hopewell Junction, NY (US)

(73) Assignee: International Business Machines Corporation, Arrmonk, NY (US)

( * ) Notice: Subject to any disclaimer, the term of this patent is extended or adjusted under 35 U.S.C. 154(b) by 0 days.

(21) Appl. No.: 14/484,329

(22) Filed: Sep. 12, 2014

(51) Int. Cl.
  *H03K 3/03* (2006.01)
  *H03L 7/24* (2006.01)

(52) U.S. Cl.
  CPC ............ *H03L 7/24* (2013.01); *H03K 3/0315* (2013.01)

(58) Field of Classification Search
  CPC ........................................ H03K 3/03
  USPC ..................................... 331/57, 44
  See application file for complete search history.

(56) References Cited

U.S. PATENT DOCUMENTS

| 4,988,960 | A  | * | 1/1991 | Tomisawa | ............ | H03C 3/245 329/325 |
| 9,024,694 | B2 | * | 5/2015 | Liu | ............ | H03L 5/00 327/156 |
| 2008/0036512 | A1 | * | 2/2008 | Yamamoto | ............ | H03H 11/265 327/155 |

* cited by examiner

*Primary Examiner* — Joseph Chang
(74) *Attorney, Agent, or Firm* — Steven J. Meyers; Hoffman Warnick LLC

(57) ABSTRACT

An on-chip frequency calibration apparatus is described. A ring oscillator generates a clock signal. A trimmable resistor is coupled to the ring oscillator. A frequency detector detects the frequency of the clock signal generated from the ring oscillator. The frequency detector includes a frequency divider component that divides the frequency of the clock signal by a predetermined number to derive an output signal having a pulse duration that is equal to at least one period of the clock signal, a capacitor, a capacitor charging current source, and a capacitor charge transistor directs a charging current generated from the capacitor charging current source to the capacitor as a function of the output signal generated from the frequency divider component. A resistor trimming unit trims the trimmable resistor in response to determining that the frequency detected by the frequency detector is less than a target frequency threshold.

20 Claims, 4 Drawing Sheets

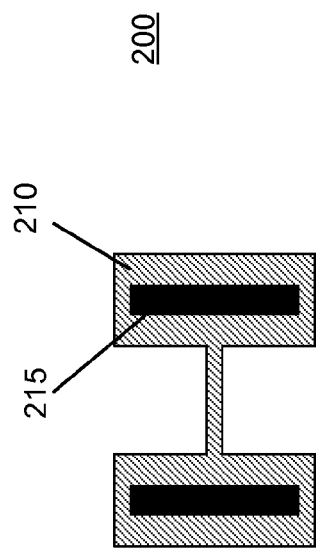
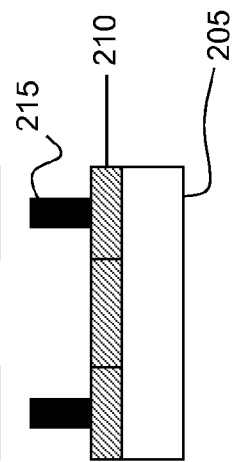
FIG. 2A
FIG. 2B
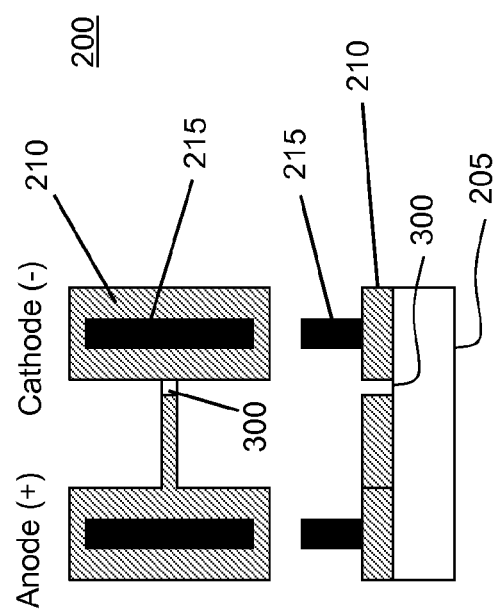
FIG. 3A
FIG. 3B

FREQUENCY CALIBRATION WITH REAL-TIME RESISTOR TRIMMING

BACKGROUND

The present invention relates generally to integrated circuit (IC) devices, and more specifically, to frequency calibration of a ring oscillator that is performed in real-time during resistor trimming.

Many IC devices have timing requirements that require clock waveforms that are precisely synchronized with a reference clock waveform. A ring oscillator is one type of clock generator that is used to generate clock waveforms in an IC device. A ring oscillator generally includes a chain of N-stages of single-ended digital inverters, with the output of the last stage fed back to the input of the first stage. An output of the ring oscillator, which is obtained from an output node of an arbitrary inverter, oscillates between two limits, a logical high and a logical low.

The frequency of the oscillating output signal generated from the ring oscillator typically depends on the number of stages of inverters, the delay time of each stage, and a wiring delay which is determined by the equivalent output resistance and the input capacitance of successive stages. For example, a lower oscillation frequency can be obtained by increasing the number of stages of inverters and inserting a resistor between the successive inverters to form a RC delay unit. Nonetheless, the frequency of the output signal generated from a ring oscillator used in an IC device can shift from its intended operating frequency. This shift or variation in frequency can be due to process variations that occur during manufacturing of the IC device, or the variation can be caused by temperature and voltage variations that occur during operation of the device. A ring oscillator that experiences a wide range of operation frequencies can adversely affect the performance and reliability of an IC device that employs a ring oscillator. As a result, calibration of the ring oscillator is often necessary to minimize the wide range of operation frequencies that can adversely affect the performance and reliability of an IC device that deploys such an oscillator.

SUMMARY

In one embodiment, there is an on-chip frequency calibration apparatus. In this embodiment, the on-chip frequency calibration apparatus includes a ring oscillator configured to generate a clock signal variable in frequency; a trimmable resistor coupled to the ring oscillator; a frequency detector configured to detect the frequency of the clock signal generated from the ring oscillator in real-time, wherein the frequency detector includes a frequency divider component that is configured to divide the frequency of the clock signal generated from the ring oscillator by a predetermined number to derive an output signal having a pulse duration that is equal to at least one period of the clock signal generated from the ring oscillator, a capacitor, a capacitor charging current source, and a capacitor charge transistor that is configured to direct a charging current generated from the capacitor charging current source to the capacitor as a function of the output signal generated from the frequency divider component; and a resistor trimming unit configured to trim the trimmable resistor to have an increased resistance in response to determining that the frequency detected by the frequency detector is less than a target ring oscillator frequency threshold.

In a second embodiment, there is an automatic frequency calibration apparatus. In this embodiment, the automatic frequency calibration apparatus comprises a ring oscillator configured to generate a clock signal; a trimmable resistor coupled to the ring oscillator; a frequency detector configured to detect a frequency of the clock signal generated from the ring oscillator in real-time, wherein the frequency detector includes a frequency divide-by-two component that is configured to divide the frequency of the clock signal generated from the ring oscillator by two to derive an output signal having a pulse duration that is equal to at least one period of the clock signal generated from the ring oscillator, a capacitor, a capacitor charging current source, and a capacitor charge transistor that is configured to direct a charging current generated from the capacitor charging current source to the capacitor as a function of the output signal generated from the frequency divider component; and a resistor trimming unit configured to trim the trimmable resistor in response to determining that the frequency detected by the frequency detector is less than a target ring oscillator frequency threshold, wherein the resistor trimming unit comprises a push current source configured to deliver current to one end of the trimmable resistor, a pull current source configured to absorb a similar amount of the current from another end of the trimmable resistor, a first switch configured to connect the push current source to the trimmable resistor, a second switch configured to connect the trimmable resistor to the pull current source, and a third switch configured to connect the push current source to the pull current source by-passing the trimmable resistor, wherein the resistor trimming unit trims the trimmable resistor in response to the first switch and the second switch being turned on while the third switch is turned off, and wherein the resistor trimming unit does not trim the trimmable resistor in response to the first switch and the second switch being turned off while the third switch is turned on.

In a third embodiment, there is a method comprising: generating a clock signal variable in frequency from a ring oscillator having a trimmable resistor coupled thereto; detecting the frequency of the clock signal generated from the ring oscillator with an analog frequency detector that includes a frequency divider component that is configured to divide the frequency of the clock signal generated from the ring oscillator by a predetermined number to derive an output signal having a pulse duration that is equal to at least one period of the clock signal generated from the ring oscillator, a capacitor, a capacitor charging current source, a capacitor charge transistor that is configured to direct a charging current generated from the capacitor charging current source to the capacitor as a function of the output signal generated from the frequency divider component, and a voltage comparator that is configured to compare a voltage at a node that connects the capacitor and the capacitor charge transistor with a predetermined threshold voltage; converting one of the pulse duration and a reciprocal frequency thereof to a voltage value with the frequency detector; determining whether the voltage value exceeds a predetermined voltage threshold representative of a target ring oscillator frequency threshold with the frequency detector; incrementing resistance of the trimmable resistor with a resistor trimming unit in response to determining that the voltage value is less than the predetermined voltage threshold, the resistor trimming unit including a push current source configured to deliver current to one end of the trimmable resistor, a pull current source configured to absorb a similar amount of the current from another end of the trimmable resistor, a first switch configured to connect the push current source to the trimmable resistor, a second switch configured to connect the trimmable resistor to the pull current source, a third switch configured to connect the push current source to the pull current source by-passing the trimmable resistor, the resistor trimming unit trims the trimmable resistor to increase the resistance by turning on the first switch and the second switch while turning off the third switch for a predetermined time interval; continuing to detect the frequency of the clock signal generated from the ring oscillator and convert one of the pulse duration and reciprocal frequency thereof to a voltage value until the voltage value exceeds the predetermined voltage threshold.

BRIEF DESCRIPTION OF THE DRAWINGS

FIGS. 2A-2B show schematic views of a structure of a trimmable resistor depicted in FIG. 1 according to one embodiment of the present invention;

FIGS. 3A-3B show schematic views of the trimmable resistor depicted in FIGS. 2A-2B before and after trimming according to an embodiment of the present invention;

DETAILED DESCRIPTION

Figure 1:
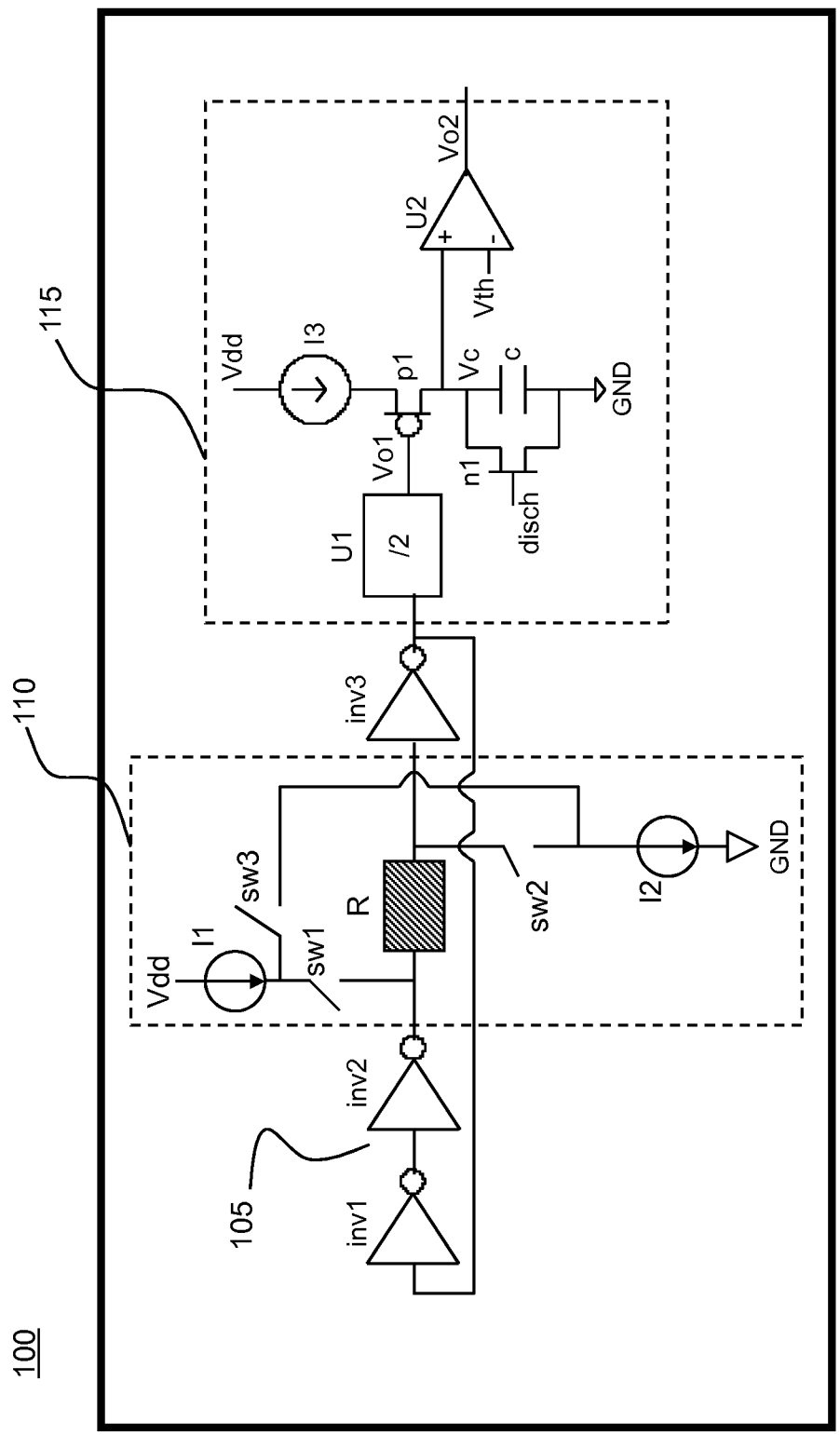
FIG. 1 shows a schematic circuit diagram of an on-chip automatic frequency calibration apparatus according to one embodiment of the present invention.

Referring to FIG. 1, there is a schematic circuit diagram of an automatic frequency calibration apparatus 100 according to one embodiment of the present invention. In one embodiment, the frequency calibration apparatus 100 can be used to calibrate the frequency of a periodic, oscillating signal generated from an electronic oscillator. Although the description that follows pertains to using the frequency calibration apparatus 100 with a ring oscillator 105, those skilled in the art will appreciate that the principles of the various embodiments of the present invention are suitable for use with other types of oscillators and frequency generators that can include, but are not limited to, a voltage controlled oscillator, a phase-locked loop, a linear oscillator, a harmonic oscillator, a nonlinear oscillator, etc.

In one embodiment, the frequency calibration apparatus 100 can be an on-chip component built on the chip (i.e., the integrated circuit—IC) that contains the oscillator. Having an on-chip frequency calibration apparatus 100 is advantageous in that it can provide good matching with other components, does not consume a large size by making the chip less bulky, reduces necessary connections on the printed circuit board to which the chip is affixed to, and is much better than any off-chip calibration with large external discrete components.

As shown in FIG. 1, the frequency calibration apparatus 100 includes a ring oscillator 105 configured to generate a periodic, output signal at a variable frequency, such as, for example, a clock signal (e.g., a square wave voltage). A trimmable resistor R is coupled to the ring oscillator 105, which can be trimmed to adjust the frequency of the output signal generated from the ring oscillator. A resistor trimming unit 110 is configured to trim the trimmable resistor R to have an increase resistance that facilitates the adjustment of the frequency of the output signal generated from the ring oscillator 105. A frequency detector 115 is configured to detect the frequency of the output signal generated from the ring oscillator 105 and determine whether the resistor trimming unit 110 has sufficiently trimmed the trimmable resistor to have a resistance that enables the output signal generated from the ring oscillator to have a frequency that is within range of a desired target frequency. If the frequency of the output signal from the ring oscillator 105 is not within range or exceeds the target frequency, then the resistor trimming unit 110, via any one of a well-known digital circuit feedback loop methodology, is instructed to trim the trimmable resistor R further to adjust the frequency of the output signal generated from the ring oscillator 105. This calibration of the output signal from the ring oscillator 105 continues until the frequency detector 115 determines that the signal is within range. Below are further details of the ring oscillator 105, the trimmable resistor R, the resistor trimming unit 110 and the frequency detector 115.

The ring oscillator 105, as shown in FIG. 1, includes a chain of inverters inv1, inv2 and inv3 connected in series, wherein the output from inverter inv1 is used as the input for inverter inv2, the output from inverter inv2 is used as the input for inverter inv3, and the output from inverter inv3 is fed back and used as the input of inverter inv1. The output of the ring oscillator 105 is obtained from an output node of inverter inv3, and can oscillate between two limits, a logical high and a logical low. Each inverter forms a stage in the ring oscillator 105 such that inverter inv1 is a first stage, inverter inv2 is a second stage and inverter inv3 is a third stage. This ring oscillator 105 formed of three stages is only an example of one type of ring oscillator that can be used with the frequency calibration apparatus 100 and is not meant to limit the various embodiments described herein. Those skilled in the art will appreciate that any type of ring oscillator formed of N-stages, where N is necessarily odd, is suitable for use with the frequency calibration apparatus 100 described herein.

In FIG. 1, the trimmable resistor R is coupled to the ring oscillator 105 in series between inverter inv2 and inverter inv3. The trimmable resistor R is a resistor that can have its thickness reduced to affect an increased resistance of the resistor. FIGS. 2A-2B show schematic views of a structure of a trimmable resistor 200 that is suitable for use as the trimmable resistor R illustrated in the frequency calibration apparatus 100 of FIG. 1 according to an embodiment of the present invention. In particular, FIG. 2A shows a top view of the trimmable resistor 200, while FIG. 2B shows a cross-sectional view of the resistor. As shown in FIGS. 2A-2B, the trimmable resistor 200 includes a first conductive layer 205, a second conductive layer 210 disposed on the first conductive layer, and a pair of electrical contacts 215 disposed on the second conductive layer. In one embodiment, the first conductive layer 205 is highly resistive in relation to the second conductive layer 210, while the second conductive layer is highly conductive in relation to the first conductive layer.

Resistance trimming of the trimmable resistor 200 can occur through an electromigration effect that occurs by supplying an electric current through the pair of electrical contacts 215. In particular, a voltage difference is applied between the pair of electrical contacts 215, such that one electrical contact has a higher voltage (e.g., an anode) than the other contact (e.g., a cathode). As a result, a current flows through the trimmable resistor 200 from the cathode to the anode. In essence, the current comprises electrons flowing from the cathode to the anode. Electromigration will occur at a certain magnitude of the current and temperature. Electromigration is a phenomenon in which atoms of a conductor, under the effect of a current flowing in the conductor, migrate in the conductor in the direction of the flow of the charged particles of the current.

In the structure of the trimmable resistor 200, the charged particles are electrons flowing from one of the electrical contacts 215 to the other contact. As a result, atoms in the second conductive layer 210 migrate in the direction of the flow of the electrons in this layer. Electromigration occurring in the second conductive layer 210 causes a void region (i.e., empty space) to form in the second conductive layer 210 as the atoms from this region become depleted.

FIGS. 3A-3B show a top view and cross sectional view, respectively, of the trimmable resistor 200 of FIGS. 2A-2B with a void 300 formed due to electromigration. As shown in FIGS. 3A-3B, the electrical contact 215 on the right-hand side of the figures is the cathode, while the electrical contact 215 on the left-hand side is the anode. When a voltage difference is applied between the pair of electrical contacts 215, the anode will have a higher voltage than the cathode. As a result, a current flows through the trimmable resistor 200 from the cathode to the anode. In essence, the current comprises electrons flowing from the cathode to the anode. Eventually, a void 300 is formed in the second conductive layer 210 in the direction of the flow of the electrons as the atoms from the conductive layer become depleted.

Essentially, an open circuit is formed because the resistor structure 200 has lost a good conducting portion due to the void region 300. That is, there is a locally depleted region in the second conductive layer 210 that results in an electrical discontinuity in this layer. This causes the electron flow along the second conductive layer 210 to move in the direction of the first conductive layer 205, which as noted above, is less conductive and more resistive than the conductive layer 210, to continue its flow to the anode, as it remains intact and electrically continuous. In this manner, the electrical resistance of the structure of the trimmable resistor 200 is increased as more electrons are flowing through the higher resistive first conductive layer 205. Generally, the resistance of trimmable resistor 200 will depend on the size of the void 300 that is formed by delivering a current therethrough. Typically, the resistance of the trimmable resistor 200 will be bigger as the void 300 becomes larger.

The trimmable resistor 200 depicted in FIGS. 2A-2B and FIGS. 3A-3B that includes two conductive layers (205 and 210) and contacting electrodes (215) can be formed from a variety of materials to produce a structure that has one of the conductive layers (210) with a higher conductivity (e.g. about 50% higher) and that is prone to electromigration-induced voiding or depletion than the other conductive layer (205). Illustrative, but non-exhaustive examples of such a bi-layer structure can include (1) metal silicide as the highly conductive layer prone to electromigration depletion (210) and heavily-doped polysilicon as the other layer (205), (2) copper (Cu) or aluminum (Al) as the highly conductive layer prone to electromigration depletion (210) and tungsten (W) or tantalum (Ta) or other refractory metals as the other layer (205), and (3) cobalt-silicon (CoSi) as the highly conductive layer prone to electromigration depletion (210) and a polysilicon as the other layer (205). All of these structure examples are characterized in that upon resistor trimming with high direct current (DC) or pulsed current with electron current flowing from cathode to the anode, the more conductive layer 210 will be subjected to electromigration voiding (or depletion) in a controllable manner that facilitates attaining a desired resistance.

Referring back to FIG. 1, the resistor trimming unit 110 that trims trimmable resistor R to adjust the frequency of the output signal generated from the ring oscillator 105 includes a first current source I1, connected to a power supply voltage Vdd terminal, that is configured to deliver current to one end of the trimmable resistor R. A second current source I2, connected to ground GND, is configured to absorb a similar amount of the current from the other end of the trimmable resistor R. A first switch sw1 is configured to connect the first current source I1 to the trimmable resistor R. A second switch sw2 is configured to connect the trimmable resistor R to the second current source I2. A third switch sw3 is configured to connect the first current source I1 to the second current source I2 by-passing the trimmable resistor R.

In this configuration, the resistor trimming unit 110 trims the trimmable resistor R in response to the first switch sw1 and the second switch sw2 being turned on while the third switch sw3 is turned off. Note that the ring oscillator 105 is non-operational while the resistor trimming unit 110 trims the trimmable resistor R. Alternatively, the resistor trimming unit 110 does not trim the trimmable resistor R in response to the first switch sw1 and the second switch sw2 being turned off while the third switch sw3 is turned on. A summary of the state for each of the switches (sw1, sw2 and sw3) in instances in which the resistor trimming unit is trimming and not trimming the trimmable resistor R is presented in Table 1.

TABLE 1

|  | sw1 | sw2 | sw3 |
| --- | --- | --- | --- |
| Trimming | on | on | off |
| Not trimming | off | off | on |

In one embodiment, the first current source I1 can operate as a push current source, while the second current source I2 can operate as a pull current source. In this configuration, current source I1 acts as a sourcing current source as it delivers current to the trimmable resistor R, while current source I2 acts as a sinking current source as it absorbs the same amount current as I1 from the trimmable resistor R. Advantages of using push-pull current sources in the resistor trimming unit 110 include, but are not limited to: (1) improving the accuracy of trimming current, and 2) allowing both sides of the trimmable resistor R to have high impedances to the power supply voltage (Vdd) or 0 Volts (GND) since a current source has very high impedance, thereby minimizing the impact of the resistor trimming unit 110 on the ring oscillator 105.

In the resistor trimming unit 105 configuration depicted in FIG. 1, use of the switch sw3 can serve to avoid current sources I1 and I2 being in a "current hunger" state, which occurs when a current source is not allowed to sink or source the nominal current. Those skilled in the art appreciate that a current source always forces a specified current through it. Therefore, in the resistor trimming unit 105, current sources I1 and I2 always force a current I_trim therethrough. Without switch sw3 in the configuration, the current sources I1 and I2 will be in the current hunger state when switches sw1 and sw2 are turned off as no current would flow through them. Upon switches sw1 and sw2 being turned on, and during the period when current sources I1 and I2 are recovering from the current hunger state to the normal current state, the behavior of current sources I1 and I2 can be unpredictable. Therefore, the current during this recovering period may deviate significantly from the specified trimming value I_trim.

The use of switch sw3 in the aforementioned manner aids in avoiding such uncertainty in the trimming current I_trim. In particular, switch sw3 can be turned on when switches sw1 and sw2 are turned off. This will connect the two current sources I1 and I2 directly so that the trimming current I_trim passes through current sources I1 and I2 all the time. In this manner, the current hunger situation can thus be avoided to preserve the accuracy in the trimming current I_trim.

The frequency detector 115, as shown in FIG. 1, can include a frequency divider component U1, a capacitor c, a capacitor charging current source 13, a capacitor charge transistor p1, a capacitor discharge transistor n1, and a voltage comparator U2. As shown in FIG. 1, the frequency divider component U1 provides a voltage output Vo1, representative of the divided ring oscillator output, to a gate of the capacitor charge transistor p1. The capacitor charging current source 13, which is connected to the power supply voltage VDD terminal, can connect to a source of the capacitor charge transistor p1. The drain of the capacitor charge transistor p1 can connect to the capacitor c. The capacitor discharge transistor n1, which is driven by a discharge signal disch, is connected across the capacitor c to facilitate the discharge of the capacitor to GND. The voltage Vc of the capacitor c, which is obtained from a connection node formed between the capacitor charge transistor p1 and the capacitor c, is inputted to the voltage comparator U2. The voltage comparator U2 compares the voltage Vc to a threshold voltage Vth which is indicative of a desired or target frequency output for the ring oscillator 105. Below are further details of these components of the frequency detector 115 along with their operation with respect to the frequency calibration apparatus 100.

In one embodiment, as illustrated in FIG. 1, the frequency divider component U1 can be a frequency-divide-by-2 (/2) circuit. The frequency-divide-by-2 circuit is only illustrative of one option for dividing the frequency of the output signal generated from the ring oscillator 105 to determine characteristics of the output signal such as the period of this signal. In the configuration of the frequency detector 115 depicted in FIG. 1, this period can be used to ascertain a pulse duration or pulse width that is generated from the output of the frequency divider component U1 (e.g., the /2 circuit) that is used to charge the capacitor c. This pulse width will directly correspond to the duty cycle of the ring oscillator 105. A pulse duration within a predetermined pulse width will be an indication that the ring oscillator 105 is generating an output signal with a frequency that meets a target. If the pulse duration does not satisfy the predetermined pulse width, then this will be an indication that the ring oscillator 105 is generating an output signal with a frequency that is not meeting the target. The resistor trimming unit 110 can then be used to trim the trimmable resistor R to increase the resistance which will increase the frequency of the output signal generated from the ring oscillator 105.

Figure 4:
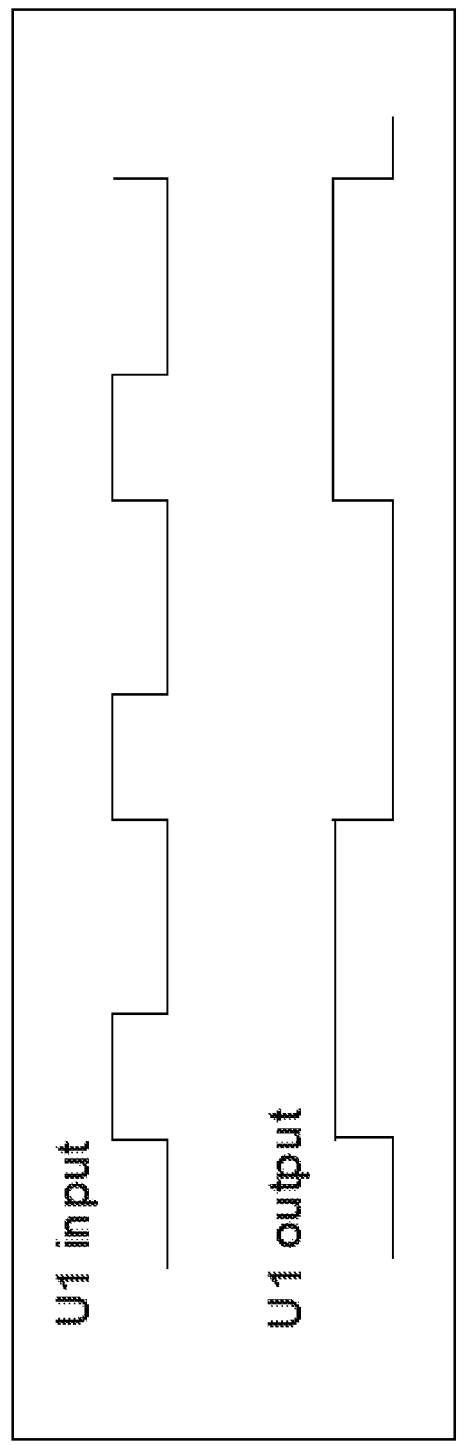
FIG. 4 shows examples of an input signal and an output signal provided to and generated from a frequency divider component deployed in a frequency detector depicted in FIG. 1 according to an embodiment of the present invention.

The operation of the frequency detector 115 depicted in FIG. 1 can be explained with reference to the waveform examples illustrated in FIG. 4. In particular, FIG. 4 shows an example of an input signal provided to the frequency divider U1 by the ring oscillator 105, U1 input, and an example of an output signal generated from the frequency divider, U1 output. These waveforms are for illustrating operation of the frequency calibration apparatus 100 and are not meant to limit the scope of the various embodiments described herein. For these waveforms, it is presumed that the frequency divider component U1 is a frequency-divide-by-2 (/2) circuit as illustrated in FIG. 1. By dividing the frequency by two in this scenario, the frequency-divide-by-2 (/2) circuit transforms the output signal generated from the ring oscillator (U1 input) to a waveform (U1 output) that is characterized with a pulse duration that is equal to at least one period of the signal provided by the ring oscillator 105 (e.g., the period itself or an integer multiplied by the period). Essentially, the duration of a logic high or logic low in the U1 output of FIG. 4 is the same as the period of the input (U1 input) provided to the frequency-divide-by-2 (/2) circuit by the ring oscillator 105. In this manner, the duration of one of these logic levels can be used as an indicator of the input frequency provided to the frequency detector 115. For the configuration depicted in FIG. 1, the logic low pulse duration is the indictor for the input frequency because a logical low will activate the capacitor charge transistor p1 since it is a p-type field-effect transistor (FET). When the capacitor charge transistor p1 is activated, then the capacitor charging current source 13 will charge the capacitor c for the duration of that pulse. Note that a longer pulse duration will translate to more of a charge on the capacitor.

Since the pulse duration that is provided by the U1 output corresponds to the frequency of the U1 input provided by the ring oscillator 105, the frequency detector 115 can then use that pulse duration which charges the capacitor c to determine the frequency of the ring oscillator. In particular, the voltage Vc, which represents the voltage of the capacitor c charged by the capacitor charging current source 13, will correspond to the frequency of the U1 input provided by the ring oscillator 105, since the pulse of the transformed signal from the frequency-divide-by-2 circuit (U1 output) is used to charge the capacitor c.

The voltage Vc, which corresponds to the voltage of the capacitor c as charged by the capacitor charging current source 13, is inputted to the voltage comparator U2. The voltage comparator U2 then compares the voltage Vc to the threshold voltage Vth. If the voltage Vc is less than the threshold voltage Vth, then this is an indication that the output signal is at a frequency that is too high. The resistor trimming unit 110 can then deactivate the ring oscillator 105 and trim the trimmable resistor R to increase its resistance and consequently the frequency of the output signal generated from the ring oscillator 105.

During instances in which the resistor trimming unit 110 trims the trimmable resistor R, the capacitor discharge transistor n1 can discharge the charge on the capacitor c and thus the voltage Vc. In particular, when the discharge signal disch is at a logic high, it will turn on the capacitor discharge transistor n1 since this transistor is an n-type FET. When the capacitor discharge transistor n1 is turned on, the voltage Vc will be pulled down to ground clearing the voltage.

After trimming the trimmable resistor R to increase its resistance, the ring oscillator 105 and the frequency detector 115 can then be powered on to assess whether the frequency of the output signal generated from the ring oscillator is operating with the desired target parameters. If the frequency detector 115 determines that the frequency generated from the ring oscillator 105 is not, then the calibration (i.e., the trimming) of the trimmable resistor R continues until the resistance is increased enough to attain a frequency output that satisfies the target threshold. Note that resistance value of the trimmable resistor R should be set to a smaller value then what is envisioned to be a desirable value, since the resistance value cannot be decreased after trimming. In this manner, the initial frequency of the ring oscillator 105 will be higher than the target value, i.e., the voltage Vc will be lower than the voltage threshold Vth. In order to trim the trimmable resistor in increments that attains small increases in resistance, those skilled in the art will appreciate that switches sw1 and sw2 should be turned on for small increments.

Figure 5:
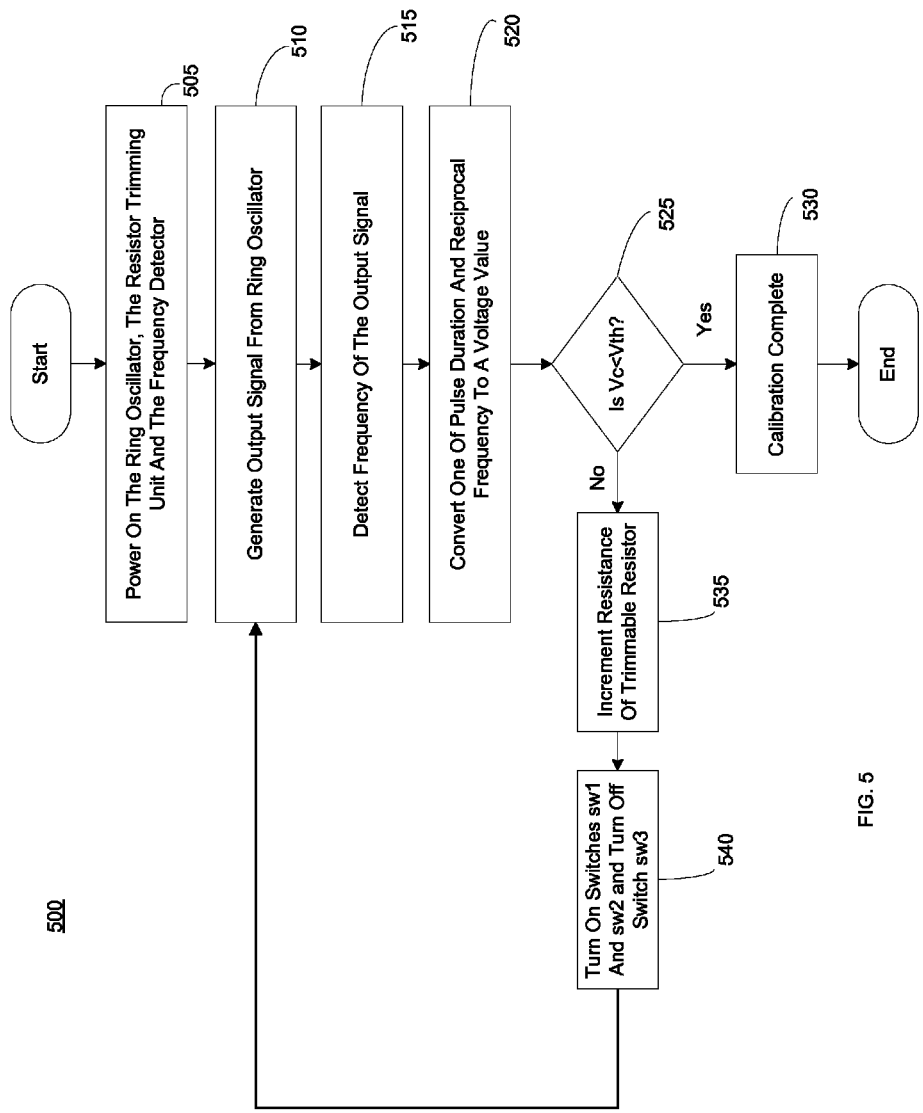
FIG. 5 is a flow chart describing a frequency calibration method that can be used with the on-chip automatic frequency calibration apparatus depicted in FIG. 1 according to an embodiment of the present invention.

FIG. 5 is a flow chart 500 describing a frequency calibration method that can be used with the on-chip automatic frequency calibration apparatus depicted in FIG. 1 according to an embodiment of the present invention. The method described in FIG. 5 begins at 505 where the frequency calibration apparatus is powered on. Initially, the trimmable resistor R will have an initial resistance that results in the ring oscillator 105 generating an output signal with a frequency that is less than a desired target threshold. So, in order to initiate the calibration of the frequency of the ring oscillator 105, the ring oscillator 105 and the frequency detector 115 will be powered on while the resistor trimming unit 115 will be off (switches sw1 and sw2 are off, while switch sw3 is on).

The ring oscillator 105 can then generate the output signal at 510. The frequency detector 115 can then detect the frequency of the output signal generated from the ring oscillator 105 at 515. This entails having the frequency-divider component U1 of the frequency detector 115 divide the signal from the ring oscillator by a predetermined number to derive a signal having a pulse duration of at least one period of the signal generated from the ring oscillator 105. The frequency-divider component U1 of the frequency detector 115 then converts at least one of the pulse duration and reciprocal frequency thereof to a voltage value at 520. As mentioned above, the pulse duration of the output signal generated from the frequency-divider component U1 is used to charge the capacitor c. Charging the capacitor c results in the voltage Vc being formed on a node that connects the capacitor c to the capacitor charge transistor p1.

The voltage comparator U2 of the frequency detector then determines at 525 whether the voltage Vc is less than the target voltage threshold Vth. If the voltage comparator determines that the voltage Vc is not less than the target voltage threshold Vth then the calibration of the ring oscillator is considered completed at 530. Alternatively, if the voltage comparator determines that the voltage Vc is less than the target voltage threshold Vth, then the calibration continues by incrementing the resistance of the trimmable resistor R at 535. The resistor trimming unit 110 can increase the resistance of the trimming resistor R at 540 by turning on switches sw1 and sw2, while turning off switch sw3 for a predetermined duration which is short enough to increase the resistance of resistor. This automatic calibration of the frequency of ring oscillator's output as embodied by process blocks 510-540 continues on the frequency detector 115 determines that the frequency of the output signal generated from the ring oscillator 105 is greater than the threshold target. That is, the voltage comparator U2 determines that the voltage Vc is greater than the threshold voltage Vth. The calibration can then be considered to be completed.

The foregoing flow chart of FIG. 5 shows some of the steps associated with using the frequency calibration apparatus of FIG. 1 to calibrate the frequency output of a ring oscillator 105. In this regard, each block in the figure represents a process act associated with performing these functions. It should also be noted that in some alternative implementations, the acts noted in the blocks may occur out of the order noted in the figures or, for example, may in fact be executed substantially concurrently or in the reverse order, depending upon the act involved. Also, one of ordinary skill in the art will recognize that additional blocks that describe other functions that can be performed may be added.

In the embodiments described herein, the frequency detector 115 takes the form of an analog frequency detector. The use of an analog frequency detector, as opposed to a digital frequency detector is due to attaining more accuracy and obviating the need for another high frequency clock.

Another benefit to using the frequency detector 115 with the resistor trimming unit 110 in the frequency calibration apparatus 100 is that it provides calibration that is more representative of the true duty cycle of the ring oscillator 105. In particular, the frequency divider component U1 (e.g., /2) in the embodiments described herein generates an output signal having a pulse duration that is exactly equal to the input frequency period provided thereto by the ring oscillator 105, thereby enabling the duty cycle of the input from the ring oscillator to be ignored.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An on-chip frequency calibration apparatus, comprising:
a ring oscillator configured to generate a clock signal variable in frequency;
a trimmable resistor coupled to the ring oscillator;
a frequency detector configured to detect the frequency of the clock signal generated from the ring oscillator in real-time, wherein the frequency detector includes a frequency divider component that is configured to divide the frequency of the clock signal generated from the ring oscillator by a predetermined number to derive an output signal having a pulse duration that is equal to at least one period of the clock signal generated from the ring oscillator, a capacitor, a capacitor charging current source, and a capacitor charge transistor that is configured to direct a charging current generated from the capacitor charging current source to the capacitor as a function of the output signal generated from the frequency divider component; and
a resistor trimming unit configured to trim the trimmable resistor to have an increased resistance in response to determining that the frequency detected by the frequency detector is less than a target ring oscillator frequency threshold.

2. The on-chip frequency calibration apparatus according to claim 1, wherein the pulse duration of the output signal generated from the frequency divider component is greater than a pulse duration of the clock signal generated from the ring oscillator, the pulse duration of the output signal enables an increased time in charging the capacitor.

3. The on-chip frequency calibration apparatus according to claim 1, wherein the frequency divider component divides the frequency of the clock signal generated from the ring oscillator by two.

4. The on-chip frequency calibration apparatus according to claim 1, wherein the frequency detector further comprises a voltage comparator that is configured to compare a voltage at a node that connects the capacitor and the capacitor charge transistor with a predetermined threshold voltage that corresponds to the target ring oscillator frequency threshold.

5. The on-chip frequency calibration apparatus according to claim 4, wherein the resistor trimming unit is configured to further trim the trimmable resistor to increase the resistance thereof in response to the voltage comparator determining that the voltage is less than the predetermined threshold voltage.

6. The on-chip frequency calibration apparatus according to claim 5, wherein the resistor trimming unit is configured to trim the trimmable resistor until the voltage comparator determines that the voltage is greater than the predetermined threshold voltage.

7. The on-chip frequency calibration apparatus according to claim 5, further comprising a discharge capacitor transistor connected across the capacitor that is configured to discharge the capacitor while the resistor trimming unit trims the trimmable resistor.

8. The on-chip frequency calibration apparatus according to claim 4, wherein the voltage at the node formed between the capacitor and the capacitor charge transistor is indicative of a charge voltage of the capacitor.

9. The on-chip frequency calibration apparatus according to claim 8, wherein the charge voltage of the capacitor corresponds to the pulse associated with the output signal generated from the frequency divider component.

10. The on-chip frequency calibration apparatus according to claim 9, wherein the charge voltage of the capacitor corresponds to the frequency output generated by the ring oscillator.

11. The on-chip frequency calibration apparatus according to claim 1, wherein the frequency detector detects the frequency of the clock signal generated from the ring oscillator by converting the frequency of the clock signal to an analog voltage signal.

12. The on-chip frequency calibration apparatus according to claim 1, wherein the ring oscillator comprises an odd number of inverters connected in series, wherein an output of each inverter is used as input to an adjacent inverter, wherein the output from a last inverter in the series is fed back as input to a first inverter in the series.

13. The on-chip frequency calibration apparatus according to claim 11, wherein the trimmable resistor is connected in series between two inverters.

14. The on-chip frequency calibration apparatus according to claim 1, wherein the resistor trimming unit comprises a push current source configured to deliver current to one end of the trimmable resistor, a pull current source configured to absorb a similar amount of the current from another end of the trimmable resistor, a first switch configured to connect the push current source to the trimmable resistor, a second switch configured to connect the trimmable resistor to the pull current source, and a third switch configured to connect the push current source to the pull current source by-passing the trimmable resistor.

15. The on-chip frequency calibration apparatus according to claim 14, wherein the resistor trimming unit trims the trimmable resistor in response to the first switch and the second switch being turned on while the third switch is turned off.

16. The on-chip frequency calibration apparatus according to claim 14, wherein the resistor trimming unit does not trim the trimmable resistor in response to the first switch and the second switch being turned off while the third switch is turned on.

17. The on-chip frequency calibration apparatus according to claim 16, wherein turning the third switch on while the first switch and the second switch are turned off maintains the current flowing from the push current source and the pull current source.

18. The on-chip frequency calibration apparatus according to claim 1, wherein the resistor trimming unit trims the trimmable resistor while the ring oscillator is non-operational.

19. An automatic frequency calibration apparatus, comprising:
a ring oscillator configured to generate a clock signal;
a trimmable resistor coupled to the ring oscillator;
a frequency detector configured to detect a frequency of the clock signal generated from the ring oscillator in real-time, wherein the frequency detector includes a frequency divide-by-two component that is configured to divide the frequency of the clock signal generated from the ring oscillator by two to derive an output signal having a pulse duration that is equal to at least one period of the clock signal generated from the ring oscillator, a capacitor, a capacitor charging current source, and a capacitor charge transistor that is configured to direct a charging current generated from the capacitor charging current source to the capacitor as a function of the output signal generated from the frequency divider component; and
a resistor trimming unit configured to trim the trimmable resistor in response to determining that the frequency detected by the frequency detector is less than a target ring oscillator frequency threshold, wherein the resistor trimming unit comprises a push current source configured to deliver current to one end of the trimmable resistor, a pull current source configured to absorb a similar amount of the current from another end of the trimmable resistor, a first switch configured to connect the push current source to the trimmable resistor, a second switch configured to connect the trimmable resistor to the pull current source, and a third switch configured to connect the push current source to the pull current source by-passing the trimmable resistor, wherein the resistor trimming unit trims the trimmable resistor in response to the first switch and the second switch being turned on while the third switch is turned off, and wherein the resistor trimming unit does not trim the trimmable resistor in response to the first switch and the second switch being turned off while the third switch is turned on.

20. A method, comprising:
generating a clock signal variable in frequency from a ring oscillator having a trimmable resistor coupled thereto;
detecting the frequency of the clock signal generated from the ring oscillator with an analog frequency detector that includes a frequency divider component that is configured to divide the frequency of the clock signal generated from the ring oscillator by a predetermined number to derive an output signal having a pulse duration that is equal to at least one period of the clock signal generated from the ring oscillator, a capacitor, a capacitor charging current source, a capacitor charge transistor that is configured to direct a charging current generated from the capacitor charging current source to the capacitor as a function of the output signal generated from the frequency divider component, and a voltage comparator that is configured to compare a voltage at a node that connects the capacitor and the capacitor charge transistor with a predetermined threshold voltage;
converting one of the pulse duration and reciprocal frequency thereof to a voltage value with the frequency detector;
determining whether the voltage value exceeds a predetermined voltage threshold representative of a target ring oscillator frequency threshold with the frequency detector;
incrementing resistance of the trimmable resistor with a resistor trimming unit in response to determining that the voltage value is less than the predetermined voltage threshold, the resistor trimming unit including a push current source configured to deliver current to one end of the trimmable resistor, a pull current source configured to absorb a similar amount of the current from another end of the trimmable resistor, a first switch configured to connect the push current source to the trimmable resistor, a second switch configured to connect the trimmable resistor to the pull current source, a third switch configured to connect the push current source to the pull current source by-passing the trimmable resistor, the resistor trimming unit trims the trimmable resistor to increase the resistance by turning on the first switch and the second switch while turning off the third switch for a predetermined time interval; and continuing to detect the frequency of the clock signal generated from the ring oscillator and convert one of the pulse duration and reciprocal frequency thereof to a voltage value until the voltage value exceeds the predetermined voltage threshold.

\* \* \* \* \*